(12) United States Patent
Arenz et al.

(10) Patent No.: US 9,726,728 B2
(45) Date of Patent: Aug. 8, 2017

(54) SWITCHING DEVICE HAVING A MEASURING APPARATUS

(71) Applicant: EATON ELECTRICAL IP GMBH & CO. KG, Schoenefeld (DE)

(72) Inventors: Bernd Arenz, Troisdorf (DE); Wolfgang Schwarz, Cologne (DE); Marc Suchalla, Duisburg (DE)

(73) Assignee: EATON ELECTRICAL IP GMBH & CO. KG, Schoenefeld (DE)

( * ) Notice: Subject to any disclaimer, the term of this patent is extended or adjusted under 35 U.S.C. 154(b) by 142 days.

(21) Appl. No.: 14/646,737

(22) PCT Filed: Nov. 27, 2013

(86) PCT No.: PCT/EP2013/074899
§ 371 (c)(1),
(2) Date: May 22, 2015

(87) PCT Pub. No.: WO2014/083073
PCT Pub. Date: Jun. 5, 2014

(65) Prior Publication Data
US 2015/0301112 A1    Oct. 22, 2015

(30) Foreign Application Priority Data

Nov. 27, 2012  (DE) .......................... 10 2012 111 485

(51) Int. Cl.
| | |
|---|---|
| *G01R 31/02* | (2006.01) |
| *G01N 27/416* | (2006.01) |
| *G01R 31/333* | (2006.01) |
| *H02H 3/08* | (2006.01) |
| *G01R 21/00* | (2006.01) |
| *H03F 3/45* | (2006.01) |

(Continued)

(52) U.S. Cl.
CPC .......... *G01R 31/333* (2013.01); *G01R 21/00* (2013.01); *H02H 3/083* (2013.01); *H03F 3/45076* (2013.01); *H02H 3/006* (2013.01); *H02H 3/105* (2013.01); *H03F 2203/45116* (2013.01); *H03F 2203/45336* (2013.01)

(58) Field of Classification Search
CPC ...................................... H02H 3/083
USPC ........................................ 324/424
See application file for complete search history.

(56) References Cited

U.S. PATENT DOCUMENTS

| | | | |
|---|---|---|---|
| 4,672,501 A * | 6/1987 | Bilac ................. | H02H 3/0935 361/42 |
| 5,940,257 A | 8/1999 | Zavis | |
| 2011/0050154 A1* | 3/2011 | Farr ................... | H02H 3/006 318/778 |

FOREIGN PATENT DOCUMENTS

| | | |
|---|---|---|
| EP | 1388920 A2 | 2/2004 |
| WO | WO 0076047 A1 | 12/2000 |

* cited by examiner

*Primary Examiner* — Edward Tso
*Assistant Examiner* — Ahmed Omar
(74) *Attorney, Agent, or Firm* — Leydig, Voit & Mayer, Ltd.

(57) ABSTRACT

A switching device has a current transformer for measuring in a potential-free manner a current to be switched by the switching device, a current sense amplifier, to which the unrectified measurement current of the current transfer is fed on the input side, and a controller, to which the output current of the current sense amplifier is fed on the input side and which is configured so as to digitalize the fed output current and to perform one or more performance-related measurements and to output the measurement results.

8 Claims, 1 Drawing Sheet

(51) Int. Cl.
*H02H 3/00* (2006.01)
*H02H 3/10* (2006.01)

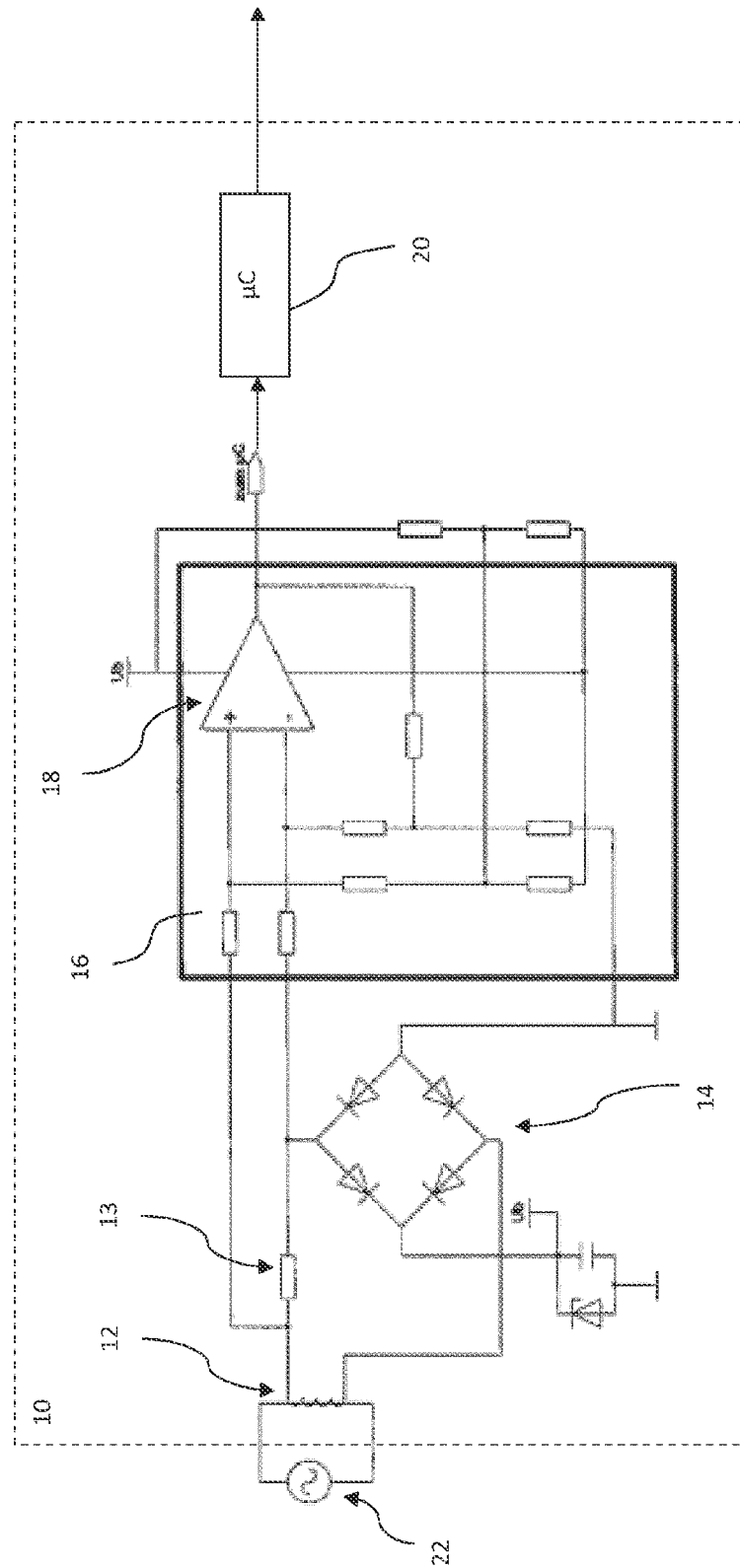

SWITCHING DEVICE HAVING A MEASURING APPARATUS

CROSS-REFERENCE TO RELATED APPLICATIONS

This application is a U.S. national stage application under 35 U.S.C. §371 of International Application No. PCT/EP2013/074899, filed on Nov. 27, 2013, and claims benefit to German Patent Application No. DE 10 2012 111 485.4, filed on Nov. 27, 2012. The International Application was published in German on Jun. 5, 2014, as WO 2014/083073 A1 under PCT Article 21(2).

FIELD

The invention relates to a switching device having a measuring device.

BACKGROUND

U.S. Pat. No. 5,940,257 discloses a device for measuring multi-phase alternating currents, designed to allow the alternating currents to be measured in as precise a manner as possible so as to be able to reliably detect an earth fault in a power distribution system for multi-phase alternating current, and to thus be able to actuate a switch disconnector in an even more precise manner. The measuring device comprises a current transformer which converts an alternating current flowing through a line, which is to be monitored, of the distribution system into a measuring alternating current. The measuring alternating current is converted by means of a rectifier circuit into a direct current, which is amplified by an operational amplifier operated as a differential amplifier and fed to a controller for detecting an earth fault.

U.S. Pat. No. 4,672,501 describes a switching device in which voltage and current values are detected continuously and monitored by a processor in order to determine the electrical state of a current distribution system. In the event of an overload current or an undervoltage, the current distribution system is interrupted by the actuation of a circuit breaker. When the overload current state or undervoltage state has passed, the contacts of the circuit breaker can be closed by actuating a controller relay. The processor is also configured to execute a measurement algorithm which can carry out power-based measurements on the basis of in a digitized, unrectified measuring current. A similar circuit is known from EP 1 388 920 A2.

SUMMARY

An aspect of the invention provides a switching device, comprising: a current transformer, configured to measure, in a potential-free manner, a current to be switched by the switching device; a current measurement amplifier, to the input of which an unrectified measuring current of the current transformer is supplied; and a controller, to the input of which an output current of the current measurement amplifier is supplied, wherein the controller is configured to digitize a supplied output current, to carry out one or more power-based measurements based on both information included in a digitized output current and additional information, wherein the controller is configured to output one or more measurement results, wherein the current measurement amplifier includes a differential amplifier, wherein a voltage is supplied to an input of the differential amplifier, wherein the voltage drops at a resistor through which the unrectified measuring current of the current transformer flows, wherein the voltage supplied can be amplified while maintaining original phase information of the current to be switched, and wherein the controller is configured to carry out one or more power-based measurements based on amplitude information and phase information included in a digitized output current, regarding the current to be switched.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 1 shows an embodiment of a circuit breaker comprising a measuring device according to the invention.

DETAILED DESCRIPTION

An aspect of the invention provides a switching device which can be used to carry out one or more precise power-based measurements.

One concept on which the present invention is based consists in using a current measurement amplifier to amplify the unrectified measuring current and providing a controller for the purpose of further processing. The amplified measuring current contains amplitude and phase information regarding the current to be switched, which information can be used, together with further information from, for example, an additional voltage measurement of the current to be switched, by the controller to carry out power-based measurements. Unlike with the typical approach in which the measuring current is rectified, using the unrectified measuring current means that none of the information which can be utilized for various power-based measurements is lost.

For example, the power conveyed by the current to be switched, the energy or a power factor measurement (cos phi) can also be determined by a measurement over a certain period of time.

One embodiment of the invention relates to a switching device comprising a current transformer for measuring, in a potential-free manner, a current to be switched by the switching device, a current measurement amplifier, to the input of which the unrectified measuring current of the current transformer is supplied, and a controller, to the input of which the output current of the current measurement amplifier is supplied and which is configured to digitize the supplied output current, to carry out one or more power-based measurements on the basis of both the information contained in the digitized output current and additional information, and to output the measurement results. The output of the measurement results is understood herein and within the meaning of the present invention to also mean processing of the measurement results by the controller itself, for example by the controller executing its main functions in a more efficient manner by evaluating or incorporating the measurement results.

The switching device can be designed to switch a plurality of currents of different phases and can comprise, for each phase, a separate current transformer having a downstream current measurement amplifier, and the controller can be configured to digitize the output currents of all the current measurement amplifiers, to carry out one or more power-based measurements, and to output the measurement results.

The controller can furthermore be configured to carry out a calibration to reduce measurement tolerances occurring as a result of current transformers and/or current measurement amplifiers.

The current measurement amplifier can comprise a differential amplifier, to the input of which a voltage is supplied, said voltage dropping at a resistor through which the unrectified measuring current of the current transformer flows.

The controller can further be configured to calculate a residual current using the information contained in the digitized output current. A calculated residual current can, for example, be evaluated by the controller in order to improve a protective function of the switching device.

The controller can also be configured to execute protective functions of the switching device, in particular to execute protective functions of the switching device based on the information contained in the digitized output current. The controller can, for example, be provided and configured primarily to execute the protective functions of the switching device, and to carry out the power-based measurements as an additional function. The measurements can also be evaluated by the controller in order to execute the protective functions of the switching device more efficiently, for example more quickly in the event of a fault or to open contacts when a power threshold is exceeded.

The switching device can be a three-pole or four-pole circuit breaker.

Further advantages and possible applications of the present invention can be found in the following description in conjunction with the embodiments shown in the drawings.

In the following description, like elements and those which have the same or related function can be provided with the same reference numerals. Absolute values are provided below merely by way of example and should not be taken as being limiting to the invention.

FIG. 1 shows a circuit breaker 10 for switching an alternating current 22. The figure only shows those circuit components which are necessary for comprehension. The circuit components which are typically also provided in circuit breakers, for example the switch elements, an electromagnetic drive for the switch elements and the drive control unit, are not shown in FIG. 1, purely for reasons of clarity.

A current transformer 12 is provided for powering the circuit breaker. The current transformer 22 generates a proportional secondary current from the alternating current 22 (primary current) to be switched. Ideally, the phase-shift angle between the primary and secondary currents is approximately zero when the current transformer 12 is operated accordingly.

The secondary current of the current transformer 12 supplies power to a bridge rectifier 14, which generates a direct current and a DC voltage Ub from the secondary current to power circuit components of the circuit breaker 10.

Upstream of the bridge rectifier 14, an AC voltage which is proportional to the secondary current is generated by means of a measuring resistor 13, through which the secondary current flows, and is applied to the inputs of an operational amplifier 18 of an integrated circuit 16 comprising a current measurement amplifier, for example an IC MAX9920 from Maxim Integrated, 160 Rio Robles, San Jose, Calif. 95134 USA.

The operational amplifier 18 is operated as a differential amplifier, without the use of phase-shifting elements, in order to amplify the supplied measuring current or the corresponding measuring voltage for the purpose of further processing while maintaining the original phase information of the alternating current 22 to be switched.

The amplified measuring current is supplied to a microcontroller 20, which is also configured to carry our measurement tasks in the circuit breaker 10 in addition to executing protective functions of the circuit breaker 10. Firmware stored in a memory of the microcontroller 20 can be provided for this purpose, said firmware configuring the controller 20 such that said controller can also carry out various power-based measurements in addition to the protective functions to be executed, and optionally take the measurement results into account when executing the protective functions.

The amplified measuring current supplied to the microcontroller 20 is first digitized by an A/D converter of the controller 20. If the microcontroller 20 is provided with data regarding an additional voltage measurement, various power-based measurements, such as a power measurement, an energy measurement (when observed over a certain period of time) or a power factor measurement (cos phi), can then be carried out.

The circuit breaker 10 shown in FIG. 1 is intended for switching one phase, but can in principle be designed to switch a plurality of AC phases, for example 3 or 4 phases (what are known as three-pole or four-pole circuit breakers). To be able to carry out power-based measurements in the event of a plurality of AC phases to be switched, a separate current transformer 12 and a separate current measurement amplifier 16 can be provided in each case for each phase, i.e. 3 or 4 current transformers and current measurement amplifiers are implemented in the circuit breaker, respectively, for 3 or 4 phases. The output currents of all the current measurement amplifiers are then fed to the microcontroller 20 in order to carry out power-based measurements.

The results of power-based measurements can be output by the microcontroller 20 to a monitoring unit, for example, displayed by means of a display device and/or for controlling the function of the circuit breaker 10 (for example for switching off AC phases when predetermined power thresholds are exceeded or missed, or when measured powers differ from predetermined power ranges). As already described above, the measurement results can also be used to improve protective functions executed by the microcontroller 20 in the circuit breaker. The microcontroller 20 can also be configured to carry out additional calculations, in particular a residual current calculation, using the information contained in the digitized output current. The calculated residual current can be used to improve the protective functions executed by the microcontroller 20 in the circuit breaker 10.

By means of appropriate routines in the firmware, the microcontroller 20 can also be configured to carry out a calibration in order to reduce measurement tolerances occurring as a result of the current transformer 12 and/or the current measurement amplifier 16. For example, the circuit breaker 10 can carry out measurements in a calibration mode if an alternating current 22 is not applied or if a defined alternating current is applied, and can store, on the basis of the results of these measurements, particular correction values which correct the deviation, caused by tolerances of the current transformer 12 and/or current measurement amplifier 16, of the measurement results from expected measurement results, and which are taken into account during additional measurements during the normal operation of the microcontroller 20 when the power-based measurements are carried out.

The invention is especially suitable for use in current-measuring switching device, the function of which can be extended to include power-based measurements or energy measurements.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

LIST OF REFERENCE NUMERALS 10 circuit breaker
12 current transformer
13 measuring resistor
14 bridge rectifier
16 integrated circuit comprising a current measurement amplifier
18 operational amplifier
20 microcontroller
22 alternating current

The invention claimed is:

1. A switching device, comprising:
    a current transformer, configured to measure, in a potential-free manner, a current to be switched by the switching device;
    a current measurement amplifier, configured to receive, as an input, an unrectified measuring current supplied by the current transformer; and
    a controller, configured to:
        receive, as an input, an amplified measuring current supplied by the current measurement amplifier,
        digitize the amplified measuring current supplied by the current measurement amplifier,
        carry out one or more power-based measurements using information included in the digitized amplified measuring current, the information included in the digitized amplified measuring current including amplitude information and phase information of the current to be switched, and
        output one or more measurement results,
    wherein the current measurement amplifier includes a differential amplifier having an input to which a voltage is supplied that drops at a resistor through which the unrectified measuring current supplied by the current transformer flows, and
    wherein the voltage that drops at the resistor through which the unrectified measuring current supplied by the current transformer flows can be amplified while maintaining original phase information of the current to be switched.

2. The device of claim 1, designed to switch a plurality of currents of different phases, the device including, for each phase, a separate current transformer including a downstream current measurement amplifier,
    wherein the controller is further configured to digitize currents supplied by all current measurement amplifiers,
    wherein the controller is further configured to carry out one or more power-based measurements using information included in the digitized currents, and
    wherein the controller is configured to output the measurement results.

3. The device of claim 1, wherein the controller is further configured to calculate a residual current using information included in a digitized amplified measuring current.

4. The device of claim 1, wherein the controller is further configured to execute one or more protective functions of the switching device based on the information included in the digitized amplified measuring current.

5. The device of claim 1, configured to be a three-pole circuit breaker.

6. The device of claim 1, wherein the controller is further configured to carry out a calibration to reduce measurement tolerances occurring as a result of at least one current transformer.

7. The device of claim 1, wherein the controller is further configured to carry out a calibration to reduce measurement tolerances occurring as a result of at least one current measurement amplifier.

8. The device of claim 1, wherein the controller is further configured to carry out a calibration to reduce measurement tolerances occurring as a result of at least one current transformer and at least one current measurement amplifier.

* * * * *